United States Patent [19]

Ibe et al.

[11] Patent Number: 4,977,561
[45] Date of Patent: Dec. 11, 1990

[54] OSCILLATION MODE SWITCHING LASER DEVICES

[75] Inventors: Hiroyuki Ibe, Kanagawa; Hideaki Yamakawa, Tokyo, both of Japan

[73] Assignee: Kabushiki Kaisha Toshiba, Kawasaki, Japan

[21] Appl. No.: 397,887

[22] Filed: Aug. 24, 1989

Related U.S. Application Data

[63] Continuation of Ser. No. 162,905, Mar. 2, 1988, abandoned.

[30] Foreign Application Priority Data

Mar. 17, 1987 [JP] Japan ............................ 62-61967
Aug. 14, 1987 [JP] Japan ............................ 62-202652
Sep. 14, 1987 [JP] Japan ............................ 62-228620

[51] Int. Cl.$^5$ ............................................. H01S 3/10
[52] U.S. Cl. ............................ 372/23; 372/19; 372/26; 372/28; 372/29
[58] Field of Search ............... 372/23, 26, 29, 25, 372/19, 20, 28, 30, 32, 18

[56] References Cited

U.S. PATENT DOCUMENTS

| | | | |
|---|---|---|---|
| 3,999,146 | 12/1976 | Lang et al. ......................... | 372/26 |
| 4,101,845 | 7/1978 | Russer .............................. | 372/26 |
| 4,660,205 | 4/1987 | Harter et al. ...................... | 372/23 |
| 4,734,911 | 3/1988 | Bruesselbach ..................... | 372/29 |
| 4,757,507 | 7/1988 | Wondrazek et al. ................ | 372/23 |

FOREIGN PATENT DOCUMENTS 57-187983 11/1982 Japan .

OTHER PUBLICATIONS

"Picosecond-Switching Optical Bistability in a TM-Wave Injected BH Laser", Extended Abstracts of the 18th (1986 International) Conference on Solid State Device and Materials, Tokyo, 1986, Y. Mori et al.
"Longitudinal-Mode Behaviors of Mode-Stabilized $Al_xGa_{1-x}As$ Injection Laser", M. Nakamura et al., J. Appl. Phys. 49(9), Sep. 1978, pp. 4644–4648.
1987 National Convention of the IEICE of Japan, p. 849, "2Gb/s Ultra High Speed Optical Memory Using a Bistable Laser Diode", A. Tomita et al.

*Primary Examiner*—Georgia Epps
*Attorney, Agent, or Firm*—Foley & Lardner, Schwartz, Jeffery, Schwaab, Mack, Blumenthal & Evans

[57] ABSTRACT

A laser device according to the present invention having a semiconductor laser which has at least two longitudinal modes $\lambda_0$ and $\lambda_1$ both of which are able to oscillate, and oscillating at the single longitudinal mode $\lambda_0$. The device further comprises input means which inputs a wave nearly coincident with $\lambda_1$ to the semiconductor laser to switch the oscillating wavelength from $\lambda_0$ to $\lambda_1$. The semiconductor laser maintains its oscillating wavelength $\lambda_1$ even if the intensity of said wave input from said input means reduces.

28 Claims, 7 Drawing Sheets

| S | R | Q' |
|---|---|---|
| 0 | 0 | Q |
| 0 | $\lambda_0$ | $\lambda_0$ |
| $\lambda_1$ | 0 | $\lambda_1$ |
| $\lambda_1$ | $\lambda_0$ | — |

OSCILLATION MODE SWITCHING LASER DEVICES

This application is a continuation of application Ser. No. 07/162,905, filed Mar. 2, 1988, now abandoned.

BACKGROUND OF THE INVENTION

The present invention relates to laser devices adaptable for optical communication, optical information processing or optical memories and more particularly relates to laser devices which are able to switch their oscillating wavelength.

Recently, in the case where computing or memorizing of optical information is required, it is necessary to convert light to electricity, and again, electricity to light. The conversions of light/electricity and electricity/light have been a problem for processing large amounts of information which involves light. Therefore, to reply to the requirements of opto-electronics, it is desired to develop optical information processors which can perform input-output operations with light itself. However, a practical device that can be used for such purposes has not been developed.

An opto-bistable semiconductor laser using a saturable absorber is known (for example, 1983 National Convention of the IEICE of Japan, p. 937, Odagiri et al). Nevertheless, in the case where a saturable absorber is used, there are problems, such as the device being unsuitable for high speed operation, and so on. This is because the response time is strictly determined by the lifetime of its spontaneous emission.

On the other hand, optical bistability between the traverse electric (TE) mode and the traverse magnetic (TM) mode in a buried heterostructure (BH) laser has been reported. ("Picosecond-Switching Optical Bistability in a TM-Wave Injected BH Laser", Extended Abstracts of the 18th (1986 International) Conference on Solid State Device and Materials, Tokyo, 1986, Y. Mori et al). In this report, a TM wave selected by means of a polarizer is injected into the facet of a InGaAsP laser $\lambda g$ 1.3 $\mu m$) operating in a TE mode. In the light-output versus light-input characteristics of the laser, a hysteresis loop is observed. It has been confirmed that the laser operates in the TM mode at the higher state of the hysteresis loop and operates in the TE mode at the lower state. And, by removing the TM wave, the bistability between both modes disappears.

However, in each bistable state, there is a mixing of the TE mode and the TM mode. Thus, the extinction ratio is small. Further, because mixing occurs, it is not suitable for multi-mode optical communication, or optical information processing and so forth.

As another experiment concerning a semiconductor laser, there has been reported a phenomena that the peak of the oscillating wavelength of an AlGaAs laser is shifted as the temperature or its drive D.C. current changes ("Longitudinal-mode behaviors of mode-stabilized $Al_xGa_{1-x}As$ injection laser" M. Nakamura et al, J. Appl. Phys. 49(9), September 1978). And in this paper, a plurality of hysteresis loops (wavelength vs. temperature or dc current) have been observed along the temperature or the dc current direction.

Further, in the Japanese Patent disclosure (Kokai) No. 57-187983, Y. Yamamoto et al, there is shown an optical amplifier using a semiconductor laser. A laser is oscillated in a single longitudinal wavelength. When injection light having a wavelength that coincides with another longitudinal mode of the laser is injected, the oscillation wavelength changes to the wave injected as the intensity of the injected laser increases. The output light is then passed through a set of wavelength filters. However, this report does not show any detail of the apparatus or of the hysteresis. It is important to have an hysteresis characteristic for memories for computing and so forth.

SUMMARY OF THE INVENTION

Accordingly, an object of the invention is to provide a new and improved laser device.

Another object of the invention is to provide a laser device performing a light-light conversion with wavelength bistability.

Another object of the invention is to provide a laser device having an extremely high extinction ratio.

Another object of the invention is to provide a laser device in which the switching mode can be maintained even if the input level becomes zero.

Another object of the invention is to provide a laser device operated at high speed.

A laser device according to the present invention has a semiconductor laser which has at least two longitudinal mode $\lambda_0$ and $\lambda_1$, both of which are able to oscillate, and is capable of oscillating at the single longitudinal mode $\lambda_0$. The device further comprises input means which input a wave nearly coincident with $\lambda_1$ to the semiconductor laser to switch the oscillating wavelength from $\lambda_0$ to $\lambda_1$. The semiconductor laser maintains its oscillating at the single longitudinal mode $\lambda_1$ even if the intensity of said wave input from the input means is reduced.

BRIEF DESCRIPTION OF THE DRAWINGS

The present invention is best understood by reference to the accompanying drawings, in which:

FIG. 6a shows an embodiment of the present invention;

FIGS. 6b and 6c show the switching characteristics of LD1 of FIG. 6a;

FIG. 8a shows an RS flip flop as another embodiment of the present invention;

FIG. 8b shows a truth table for the RS flip flop of FIG. 8a;

FIG. 9a is an illustration for describing one of the oscillating conditions of the RS flip flop of FIG. 8a;

FIG. 9b shows another relationship of the input and output of the RS flip flop of FIG. 8a;

DETAILED DESCRIPTION OF THE PREFERRED EMBODIMENTS

Figure 1:
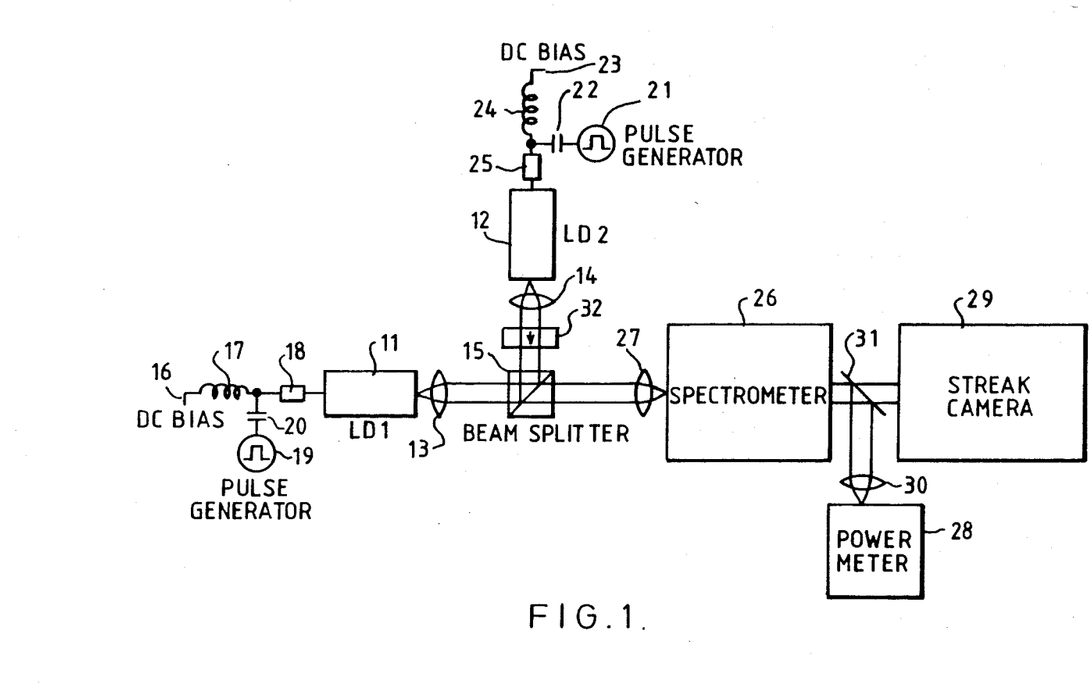
FIG. 1 is an illustration showing the experiment equipment of the present invention.

Referring now to FIG. 1, there is shown schematically an experiment on which the present invention is based. In the experimental apparatus, a first semiconductor laser (LD1) 11 and a second semiconductor laser (LD2) 12 are optically connected to each other through two lens systems 13, 14 and a beam splitter 15.

LD1 is a slave laser having wavelength bistability, and LD2 is a master laser performing a light injection. In this experiment, both the laser LD1 and LD2 are InGaAsP DFB (Distributed Feed-Back) lasers. The DFB laser is one that oscillates in a single longitudinal mode. The oscillation wavelength of LD1 is made coincident with the Bragg wavelength by shifting a part of its grating by $\lambda/4$, thus causing oscillation at $\lambda_0$. LD2 oscillates at $\lambda_1'$ by controlling its temperature.

LD1 emits laser light and has a DC bias supply through an inductor 17 and a resistor 18. LD1 is able to return to its original oscillation mode by applying a negative pulse from a pulse generator 19, through a capacitor 20; that is, by reducing the injection current.

LD2 emits laser light and is able to achieve an emission power which enables it to switch the oscillation wavelength of LD1 by applying a positive pulse from a pulse generator 21 through a capacitor 22. To LD2, a DC bias supply 23 is also connected through an inductor 24 and a resistor 25. The laser light transferred through the beam splitter 15 is incident on a spectrometer 26 through lens system 27, and here, a spectrum of the optical output is detected. Further, in the apparatus, a power meter 28 for detecting the output power of the spectrum and a streak camera 29 for observing the spectrum wave shape are prepared. Also shown are a lens system 30 and a mirror 31.

Using the measurement system, the first semiconductor laser LD1 is oscillated firstly at the main longitudinal mode wavelength $\lambda_0$ (1.29427 $\mu$m) by applying D.C. bias. This wavelength is the Bragg wavelength of LD1. Then, the second semiconductor laser LD2 is oscillated at the wavelength $\lambda_1'$ (1.29307 $\mu$m) by applying the positive pulse together with the D.C. bias. The wavelength $\lambda_1'$ is nearly coincident with one of the sub-longitudinal modes. The emitted laser light is injected into the facet of LD1 through the beam splitter 15. A beam separator 32 may be inserted at the position, for example, between the lens system 14 and the beam separator 15 to pass only the laser light transferring from LD2 to LD1.

Figure 2A:
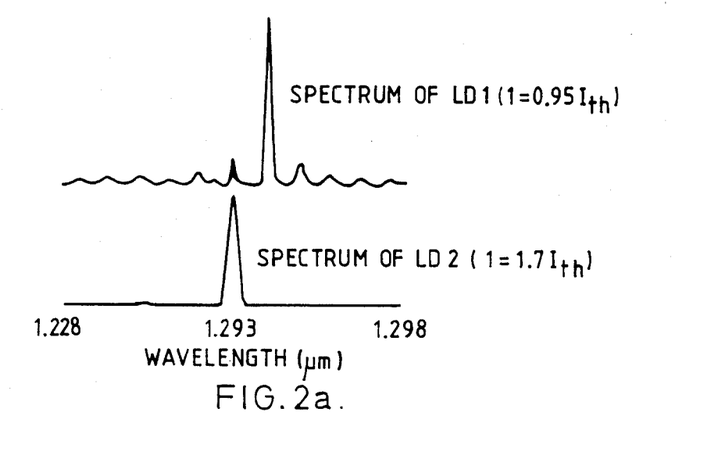
FIG. 2a shows a characteristic of the wave shape of the lasers used in FIG. 1.
Figure 2B:
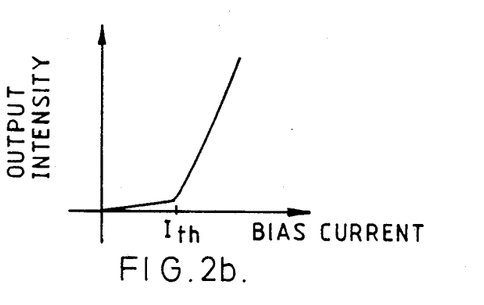
FIG. 2b shows the definition of threshold current Ith.

FIG. 2a shows the characteristics of LD1 and LD2. The bias condition is 0.95 Ith for LD1 and 1.7 Ith for LD2. Here, Ith is the threshold value of the drive current for the laser. As shown in FIG. 2b, which shows bias current versus light output, the threshold value of the drive current is the point at which light output begins to rise sharply with bias current, or, in other words, the point at which lasing begins. The actual threshold current for LD1 is 13 mA and the actual threshold current for LD2 is 25 mA. Both LD1 and LD2 have no kinks in their bias current versus light output characteristics as far as the output power is less than 5 mW, lase in single longitudinal modes, and have submode suppression ratios less than $-35$ dB when they are biased at 1.5 Ith.

As seen in FIG. 2a, the laser light wavelength $\lambda_1$, emitted from LD2 is controlled in order to be nearly coincide with the wavelength of the submode on the short wavelength side of LD1. This experiment in FIG. 2 was performed under the condition that the drive current of LD1 is below the threshold value, for observing th relation of the spectrums of LD1 and LD2. Thus, the laser LD1 is not oscillated in a single longitudinal mode yet.

Figure 3:
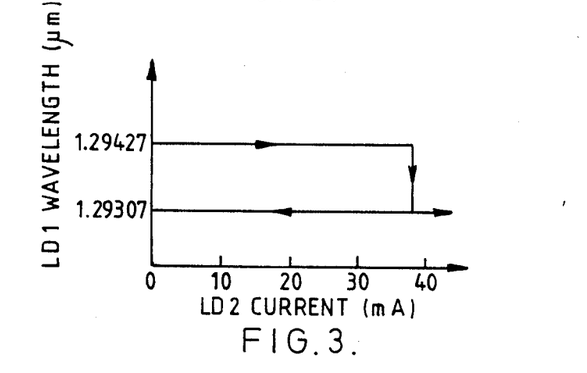
FIG. 3 shows a characteristic of the master laser drive current vs. slave laser wavelength.

FIG. 3 shows the characteristics of the LD2 drive current vs. LD1 oscillating wavelength, under the condition that the drive current of LD1 has risen to 25 mA (1.9 Ith).

When the drive current of LD2 goes to 38 mA, the wavelength of LD1 switches from the main mode ($\lambda_0 = 1.29427$) to the submode ($\lambda_1 = 1.29307$). This is known as mode jumping based upon an injection locking phenomena. However, after LD1 oscillates at the submode once, the oscillating wavelength of LD1 is no longer dependent on the LD2 drive current. Even if the LD2 drive current was reduced to zero (or, the laser light injection is shut off), LD1 continued to oscillate at $\lambda_1$ in single longitudinal mode and did not return to the original mode.

As described above, wavelength bistability was observed in this system.

Figure 4A:
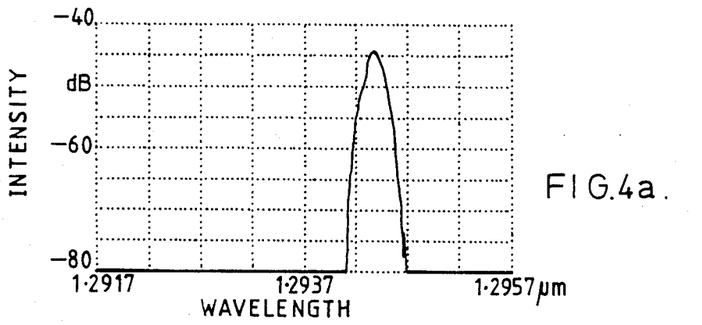
FIGS. 4a to 4c are characteristics of the wavelength oscillation.
Figure 4B:
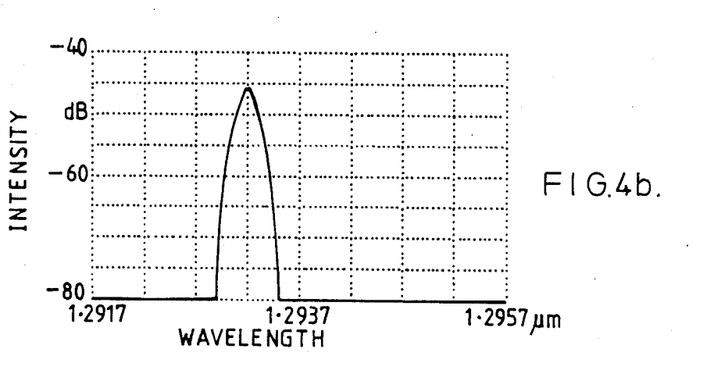
Figure 4C:
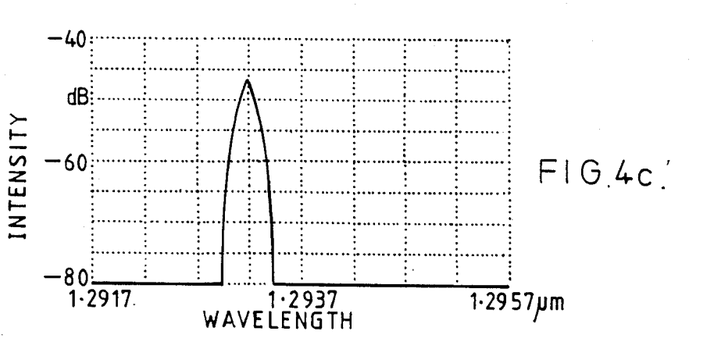

FIGS. 4a to 4c are observed data and respectively show the spectrum of LD1.

FIG. 4a is the spectrum which corresponds to the original condition. Here, the LD1 drive current is 24 mA (1.8 Ith$_1$) and the LD2 drive current is 0 mA. FIG. 4b shows the spectrum of the light LD2 is injecting. The LD1 drive current is 24 mA (1.8 Ith$_1$) and the LD2 drive current is 44 mA (1.8 Ith). FIG. 4c is the spectrum when LD2 injection is stopped. The LD1 drive current is 24 mA (1.8 Ith$_1$) and LD2 drive current is 0 mA. Ith$_1$, Ith$_2$, respectively, mean the threshold value of the drive current of LD1 and LD2.

FIGS. 4a to 4c show that the submode suppression ratios were less than $-35$ dB in every state.

$\lambda_0$, $\lambda_1$ and $\lambda_1'$ are the transverse electric modes. The experiment was done at the condition LD1 and LD2 are set at the same plane.

The wavelength memory operation occurs when the bias level of LD1 is 1.4 Ith or more. In conditions below this value, two modes of operation occur consisting of the main mode and the submode depending on the intensity of the injected wave, and the light output ratio between the two change analogously.

As for methods to reset the oscillating wavelength to the main mode, when the bias level is 1.4 Ith or more, two methods can be adopted as follows:

(1) To reduce the bias level of LD1 to near the threshold value.

(2) To perform injection locking by injecting light with a wavelength corresponding to that of the main mode of LD1.

Figure 5:
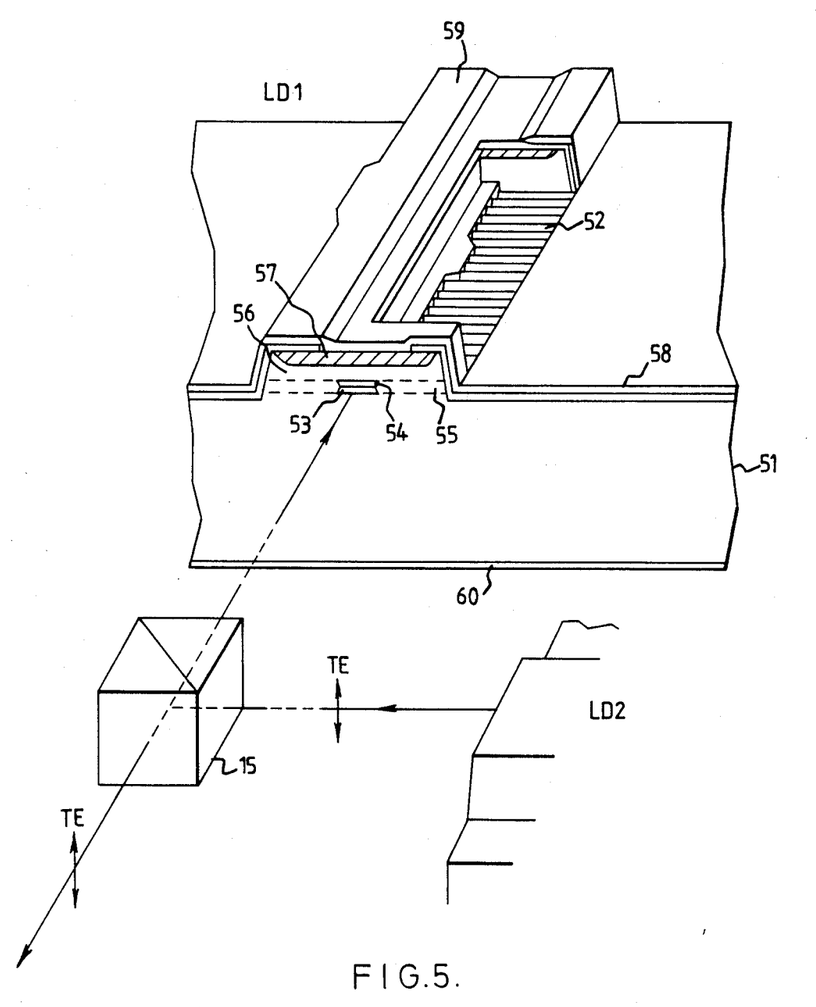
FIG. 5 is an illustration showing the DFB laser used in the equipment of FIG. 1.

FIG. 5 is an illustration showing the structure of the DFB lasers LD1 and LD2 used in the equipment of FIG. 1.

At the surface of a P type InP substrate ($2 \times 10^{10}$ cm$^{-3}$ Zn doped) 51, a grating 52 is formed by periodically grooving the substrate. On a part of the grating 52, a wave guide layer 53 of P type InGaAsP ($1 \times 10^{18}$ cm$^{-3}$ Zn doped) and an active layer 54 of P type InGaAsP ($2 \times 10^{17}$ cm$^{-3}$ Zn doped) are stacked having a strip shape. In order to shift the grating by $\lambda/4$, a part of the wave guide layer 53 and the active layer 54 is made wide, as is conventional. Buried layers 55 of undoped InGaAsP are formed on both sides of the stacked layers 53 and 54. Further, on the active layer 54 and buried layer 55, a clad layer 56 of n type InP ($1 \times 10^{18}$ cm$^{-3}$ Sn doped) and a contact layer 57 on n$^+$ type InGaAsP ($2 \times 10^{18}$ cm$^{-3}$ Sn doped) are formed. On the surface of this structure, there is formed an SiO$_2$ layer 58. At the contact region, an electrode 59 of Au-Ge/Cr/Au is formed. Furthermore, at the rare surface of the substrate an electrode 60 of Au/Zn/Au/Cu/Au is attached.

As for the observed phenomena, it can be considered as follows.

The DFB laser is known to oscillate at a stable single longitudinal mode. Certainly, even if a bias modulation is applied, it continues to oscillate in a single longitudinal mode. However, as seen in the experiment, the adjoining longitudinal modes have a possibility to oscillate. In a highly biased state, the gain which is considered for the loss of light, becomes greater than 1 both for the main longitudinal mode ($\lambda_0$) and for the sub longitudinal mode ($\lambda_1$). However, in actuality, the gain of the adjoining mode near the oscillating mode is suppressed because of hole burning in the main mode. Therefore, the DFB laser oscillates at a single longitudinal mode ($\lambda_0$). However, in this condition, if a laser light having a wavelength which is nearly coincident with the wavelength of the sub longitudinal mode is injected from outside, the gain of the longitudinal mode ($\lambda_1$) increases by injection locking of light, and thus, the sublongitudinal mode of $\lambda_1$ begins to oscillate and at the same time the gain of the main longitudinal mode is suppressed. And even if the intensity of the external laser light is decreased, the oscillation at $\lambda_1$ is maintained because the gain of the $\lambda_0$ mode is suppressed.

According to the device described, it is possible to switch the oscillating wavelength perfectly. Thus, there is also no problem concerning the extinction ratio.

Further, between the intensity of the input light and the oscillating wavelength, superior hysteresis characteristics can be obtained.

Furthermore, because of using the switching between oscillation in longitudinal modes, essentially, the device can operate at high speed.

Based on the experiments described above, several embodiments of the present invention will now be shown.

EXAMPLE 1

Figures 6A, 6B, 6C:
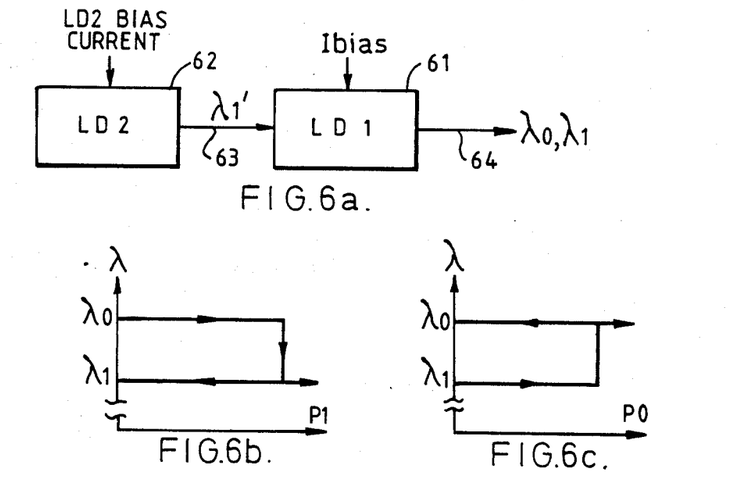

FIG. 6a is an illustration of an embodiment of the present invention.

The device comprises a first semiconductor laser [LD1] 61 and a second semiconductor laser [LD2] 62. The DFB laser described can be used for LD1 and LD2.

A laser light 63 emitted from LD2 is guided and injected into the facet of LD1, then, a laser light 64 is output from LD1.

LD1 originally oscillates at the wavelength $\lambda_0$, on the other hand, LD2 oscillates at the wavelength $\lambda_1'$. The wavelength $\lambda_1'$ is nearly coincident with $\lambda_1$.

When a drive current Ibias higher than the threshold value Ith is applied to LD1 and $\lambda_1$ is injected into LD1, LD1 begins to oscillate at the wavelength $\lambda_1$. The laser LD1 has a wavelength bistability as shown in FIG. 3, such that a mode shift occurs when the bias current to LD2, and thus the intensity of $\lambda_1$, reaches a certain level. Then, LD1 oscillates at $\lambda_1$ even after removing the laser injection from LD2.

The device thus fabricated can be used as a basic component in opto-electronics. For instance, it can be applied for optical memories, computing, etc. A high extinction ratio and high speed can be achieved. Not only that, but it can be applied widely to the fields of opto-communication and optical information processing.

FIG. 6b and FIG. 6c show one example of the way in which the output of LD1 can be shifted between modes using different injection wavelengths when Ibias is higher than the threshold value Ith. FIG. 6b shows that the output of LD1 can be shifted from $\lambda_0$ to $\lambda_1$ by injecting a wave at about $\lambda_1$ above a predetermined intensity. Once this occurs, the output remains at $\lambda_1$ regardless of the injected intensity. To shift back to $\lambda_0$, a wave at $\lambda_0$ above a predetermined intensity may be injected, as shown in FIG. 6c. Once this occurs, the injected wave may be terminated and LD1 will continue to oscillate at $\lambda_0$.

EXAMPLE 2

Figure 7A:
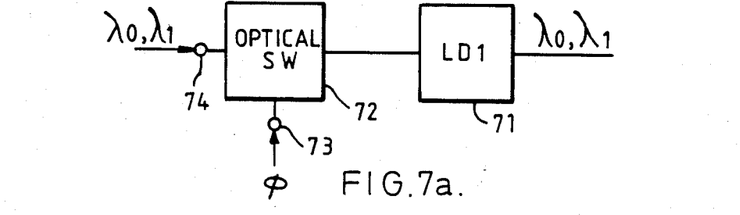
FIG. 7a shows a D-flip flop as another embodiment of the present invention.

FIG. 7a is a block diagram showing an application for an optical D-flip flop.

This flip-flop comprises a first semiconductor laser [LD1] 71 and an optical switch (light incident means) 72 formed at the input side of the first semiconductor laser LD1. The DFB laser is adopted as LD1 in this embodiment. The optical switch 72 is, for example, a directional optical coupler switch using LiNbO$_3$, LiTaO$_3$, GaAs or InP as its material or a loss type switch. The optical switch 72 passes its input light when a clock $\phi$ is input to the terminal 73, and outputs this light to LD1 as external incident light. At the input portion 74 of the optical switch 72, a first light having the wavelength $\lambda_0$ and a second light with the wavelength $\lambda_1$ are selectively input.

Figure 7B:
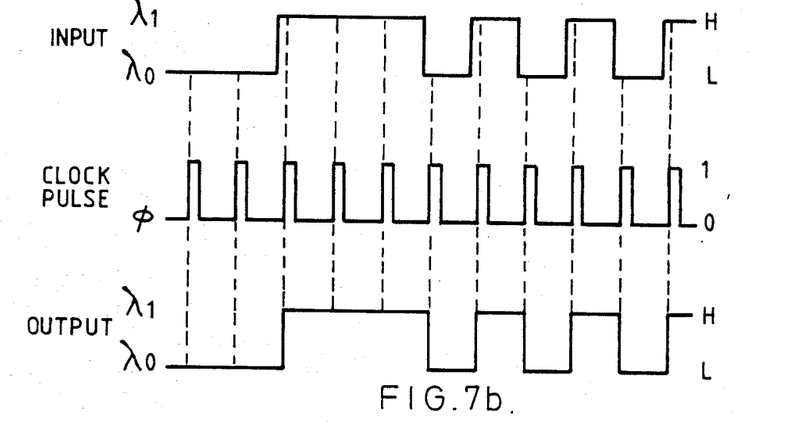
FIG. 7b shows the relationship between input and output of the D-flip flop.

In this instance, the optical switch 72 turns on at the point in time the clock pulse $\phi$ inputs, thus the input light is injected to LD1. In the case where the wavelength of the input light is $\lambda_0$, the wavelength of the output of LD1 becomes $\lambda_0$. On the other hand, in the case where the wavelength of the incident light is $\lambda_1$, the wavelength of the emission light of LD1 becomes also $\lambda_1$. Therefore, the relationship between the input digital data an output digital data can be illustrated as shown in FIG. 7b.

According to this embodiment, an optical D-flip flop can be realized with the DFB laser 71 which shows the wavelength bistability and an optical switch 72, using wavelength bistability. And a wide extinction ratio can be realized. Further, because of using the injection locking of light, the device operates at high speed. Further, this device can be widely used, and it is easy to fabricate.

EXAMPLE 3

Figures 8A, 8B, 9A:
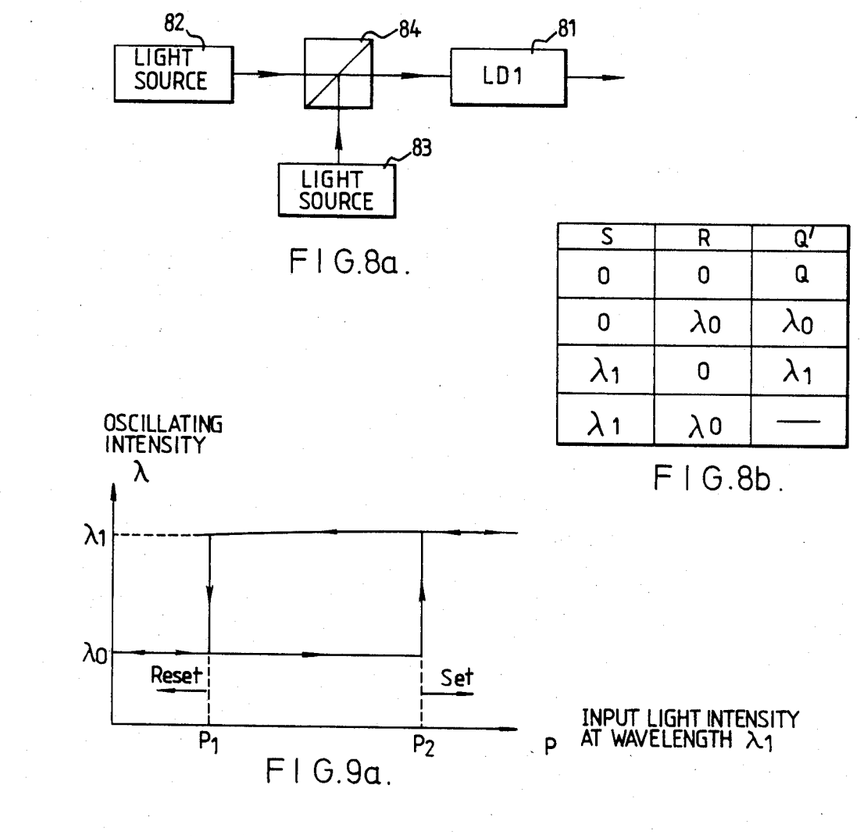

FIG. 8a is a block diagram showing an optical RS flip flop as an embodiment of the present invention.

The flip flop is comprised of a DFB laser 81 having optical bistability, first and second light sources 82 ($\lambda_0$) and 83 ($\lambda_1$), and a beam splitter 84.

The DFB laser [LD1] 81 is the same as the one shown in the experiment. As for the first and second light sources 82, 83, there is a $\lambda/4$ shift.

DFB lasers are used in this example. The light beams output from the light source 82 and 83 are injected into LD1. In this case, a photo isolator may be provided for the emission side of each of the light sources 82 and 83.

When the second light source 83 turns on while biasing LD1 with a drive current of 25 mA, which is two times larger than the threshold value, the oscillating wavelength switches from the main oscillation mode $\lambda_0$ to the adjoining oscillation mode $\lambda_1$, thus becoming a memorized state. On the other hand, it is possible to reset the memorized state to the original state by injecting light with a wavelength $\lambda_0$ of the main oscillation mode by turning on the first light source 82. The result of the state transition is shown in FIG. 8b. In this manner, an RS flip flop operation can be achieved.

According to the present embodiment, the optical RS flip flop can be realized by DFB laser [LD1] having wavelength bistability, light sources for respectively emitting a light of a single wavelength, and a beam splitter. Features similar to those described in former embodiments can be obtained.

While having been described using the above embodiments, the present invention is not limited thereby. For instance, in the optical switches described in the embodiments of FIG. 7a, an optical clock may be used as the clock $\phi$. This can be accomplished by forming the optical switch from a kar effect device or a device using a saturable absorber.

Further, the laser device according to the present invention may be used to provide a hysteresis characteristic as shown in FIG. 9a. In order to produce this type of hysteresis, Ibias for LD1 should be set between Ith and about 1.4 Ith. A hysteresis loop develops at Ith and the size of the hysteresis loop decreases as Ibias approaches about 1.4 Ith. It should be understood that the value of 1.4 Ith is approximate and may vary from this figure. Above about 1.4 Ith, the hysteresis disappears resulting in the characteristic of FIG. 3.

In FIG. 9a, a hysteresis curve of oscillating output wavelength $\lambda$ vs. incident light density P at wavelength $\lambda$ is shown. The output wavelength $\lambda_0$ occurs in the condition $P < P_2$. However, the wavelength changes to $\lambda_1$ when the intensity goes to $P > P_2$. After that, the wavelength $\lambda_1$ is maintained in the condition $P > P$ ($P_1 < P_2$). Then, the wavelength returns to $\lambda_0$ at $P < P_1$.

Figure 9B:
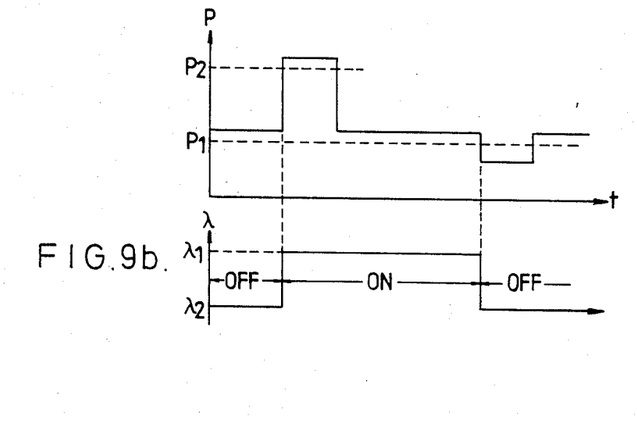

As described, it is also possible to give a hysteresis characteristic to the oscillation wavelength in a relatively low bias condition above a threshold. That is, as shown in FIG. 9b, the low level of the injection light pulse is set between $P_1$ and $P_2$, and the high level of the injection light pulse is set above P. The oscillation wavelength of LD1 in FIG. 6a is usually $\lambda_0$. However, if such a light pulse is injected, the output oscillation wavelength of LD1 is in a memorizing condition. Then, this optically memorizing condition is maintained even after the input light goes to a low level. In order to reset the memorizing condition, the drive current I bias can be reduced close to the threshold value Ith, or the incident light intensity can be set below $p_1$.

Figure 10:
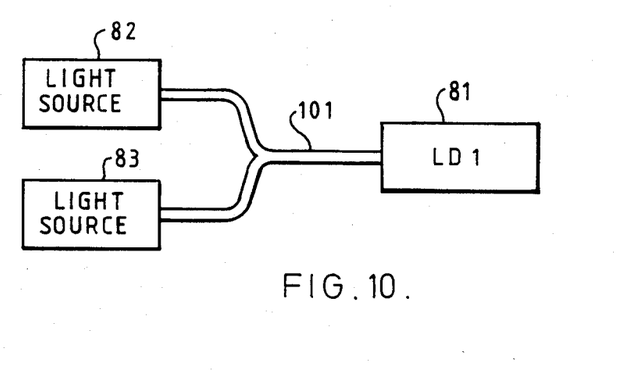
FIG. 10 is a figure showing one type of connection between components.

Further, as shown in FIG. 10, instead of the beamsplitter 84 in FIG. 8a, it may possible to guide the incident light by optical waveguide 101.

THEORETICAL ASPECTS

Figure 11:
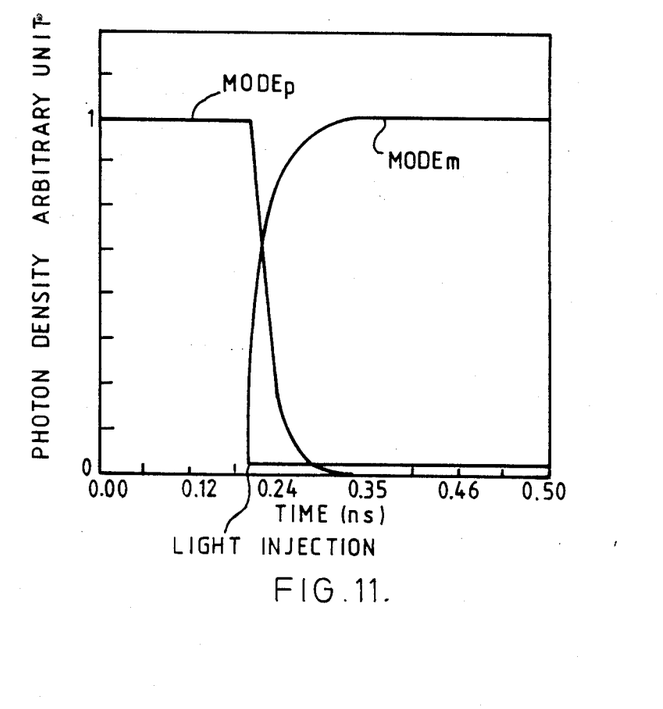
FIG. 11 is a graph showing the result of numerical analysis of a two mode rate equation.

A $\lambda/4$ shifted DFB laser diode oscillates at the Bragg wavelength and the sub-modes are suppressed because of the difference in mode gain. Injecting light, whose wavelength is near the suppressed mode, to the laser, the mode which has been lasing is suppressed and the other mode begins to lase. This wavelength state change can be explained by a two-mode rate equation. Now, let the photon density of radiation mode without the injection of light be Sp, and the photon density of the other mode be Sm, the linear gain be $\alpha$, the gain suppression coefficient of mode interaction be $\theta$, the rate equations are then $$\dot{S}p = GpSp + C\frac{N}{t_s} \tag{1}$$

$$\dot{S}m = GmSm + C\frac{n}{t_s} + \alpha thm\text{Sin} \tag{2}$$

$$\dot{n} = \frac{I}{ev} - GpSp - GmSm - \frac{n}{t_s} \tag{3}$$

$$Gp = \alpha p - \gamma pSp - \theta pmSm - \alpha thp \tag{4}$$

$$Gm = \alpha m - \gamma mSm - \theta mpSp - \alpha thm. \tag{5}$$

where n is the carrier density, C is the spontaneous emission factor, I is the current, e is the electron charge, V is the volume of the active region, $t_s$ is the carrier life time, $1/\alpha th$ is the photon lifetime and Sin is the external injection light density. When external light whose wavelength is near the mode m, is injected into the laser diode, the mode p is suppressed, and simultaneously the mode m begins to evolve. Solving equations (1) to (5) numerically, provides an estimate of the switching time of the radiation mode. The calculated result is shown in FIG. 11. The injected light density was assumed to be 5 percent of the radiation photon density, and the linear mode gain difference was assumed to be 5 cm$^{-1}$. If both $\alpha p-\alpha thp$ and $\alpha m-\alpha thm$ are positive and $\theta pm\theta mp$ is greater than $\gamma p\gamma m$, the rate equation has two solutions, and therefore the laser shows bistability. Under high bias condition, both linear net mode gain can be positive. Since the gain suppression factor $\gamma p$, $\gamma m$, $\theta pm$, and $\theta mp$ are large due to hole burning, the laser operates in a single mode. The rise time of mode m was calculated to be 100 ps. This value depends on the injected light density. The more the external light injected, the faster the switching speed. By the way, a rate equation does not treat phase of light, and thus the time required for locking is not considered. The injection locking time is expressed as the reciprocal of the locking frequency range and is about several tens picoseconds.

What is claimed is:

1. A laser device, comprising;
a semiconductor laser, said semiconductor laser having at least two longitudinal modes with wavelengths $\lambda_1$ and $\lambda_1$ at which it is able to oscillate, and means for oscillating said semiconductor laser at the single longitudinal mode $\lambda_0$; and
means for causing said semiconductor laser to oscillate in said longitudinal mode $\lambda_1$ without requiring a sustained external light input comprising input means for at least temporarily inputting to said semiconductor laser a wave of a wavelength which nearly coincides with said wavelength $\lambda_1$ of said semiconductor laser from $\lambda_0$ to $\lambda_1$.

2. A laser device according to claim 1, including means for returning said semiconductor laser to its oscillating wavelength $\lambda_0$ from said wavelength $\lambda_1$ by inputting a wave with wavelength which nearly coincides with said wavelength $\lambda_0$ to said semiconductor laser.

3. A laser device according to claim 1, including means for returning said semiconductor laser to its oscillating wavelength 0 from said wavelength $\lambda_1$ by reducing a drive circuit of said semiconductor laser to near a threshold value.

4. A laser device according to claim 1, wherein said input is an optical switch means having a wave input section for receiving a first wave and a second wave and a clock input section for selecting an output wavelength from said first wave and said second wave.

5. A laser device according to claim 1, wherein said input means comprises a first wave source for producing a first wave, a second wave source and a connecting means to connect said first and second wave sources to said semiconductor laser, wherein one of said waves is selectively input to said semiconductor laser.

6. A laser device according to claim 5, wherein said connecting means is a beam splitter.

7. A laser device according to claim 5, wherein said connecting means is an optical wave guide.

8. A laser device accordinq to claim 1, wherein said input means is a laser source.

9. A laser device according to claim 1, wherein one of said longitudinal modes is at the Bragg wavelength, and the other one is a sub mode.

10. A laser device according to claim 1, wherein said semiconductor laser has an active layer and a grating means along the active layer.

11. A laser device according to claim 1, wherein said semiconductor laser is $\lambda/4$ shifted.

12. A laser device according to claim 1, wherein drive current of said laser is above a threshold value of said semiconductor laser.

13. A laser device according to claim 1, wherein said semiconductor laser has a drive current and a threshold value, said drive current of said laser being 1.4 times higher than the threshold value.

14. A laser device according to claim 1, further comprising:
   optical isolator means positioned between said semiconductor laser and said input means to selectively allow the wave to transfer from said input means to said semiconductor laser.

15. A laser device according to claim 1, wherein the transverse mode of said semiconductor lasers are the same.

16. A laser device according to claim 1, wherein the mode of said input wave and the modes of the output waves $\lambda_0$, $\lambda_1$ of said semiconductor laser are transverse electric modes.

17. A laser device, comprising:
   a first semiconductor laser, said first semiconductor laser having at least two longitudinal modes with wavelengths $\lambda_0$ and $\lambda_1$, respectively, both of which are able to oscillate, and means for causing said first semiconductor laser to oscillate at the single longitudinal mode $\lambda_0$; and
   means for causing said semiconductor laser to oscillate at the single longitudinal mode $\lambda_1$ without requiring a sustained external light input comprising a second semiconductor laser for at least temporarily inputting a laser wave which nearly coincides with said wavelength $\lambda_1$ to said first semiconductor laser to switch the oscillating single longitudinal mode of said first semiconductor laser from $\lambda_0$ to $\lambda_1$,
   wherein said first semiconductor laser is operated with a wavelength bistability between said single longitudinal modes of $\lambda_0$ and $\lambda_1$.

18. A method, comprising:
   operating a semiconductor laser having at least first and second longitudinal modes with first and second wavelengths, respectively, so that the semiconductor laser oscillates in said first mode; and
   altering the oscillating mode of said semiconductor laser to cause said semiconductor laser to oscillate in said second longitudinal mode without requiring an external light input by at least temporarily injecting a wave having a wavelength close to that of the second mode into said semiconductor laser.

19. A method as claimed in claim 18, including eliminating said injected wave with the semiconductor laser continuing to oscillate in said second mode.

20. A method as claimed in claim 18, including returning said semiconductor laser to said first oscillating mode by injecting a wave having a wavelength close to that of said first mode.

21. A method as claimed in claim 20, including eliminating said injected wave with the semiconductor laser continuing to oscillate in said first mode.

22. A method as claimed in claim 18, including returning said semiconductor laser to said first mode by reducing a driving current to said semiconductor laser.

23. A method according to claim 18 wherein said altering step further comprises maintaining a driving current of said semiconductor laser above a predetermined value.

24. A laser device according to claim 17 wherein said causing means further comprises means for maintaining a driving current of said semiconductor laser above a predetermined value.

25. A laser device accordiing to claim 17 wherein said causing means further comprises means for maintaining a driving current of said semiconductor laser above a predetermined value.

26. A method according to claim 23 wherein said predetermined value is 1.4 times a threshold value for said semiconductor laser.

27. A laser device according to claim 24 wherein said predetermined value is 1.4 times a threshold value for said semiconductor laser.

28. A laser device according to claim 25 wherein said predetermined value is 1.4 times a threshold value for said semiconductor laser.

* * * * *